(12) United States Patent
Iliffe-Moon

(10) Patent No.: US 11,909,433 B2
(45) Date of Patent: Feb. 20, 2024

(54) SMARTPHONE MOVABLE SUPPORT AND METHOD OF OPERATING A SMARTPHONE MOVABLE SUPPORT

(71) Applicant: Bayerische Motoren Werke Aktiengesellschaft, Munich (DE)

(72) Inventor: Etienne Iliffe-Moon, Menlo Park, CA (US)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 437 days.

(21) Appl. No.: 17/330,324

(22) Filed: May 25, 2021

(65) Prior Publication Data

US 2022/0385327 A1    Dec. 1, 2022

(51) Int. Cl.
| | | |
|---|---|---|
| *H04B 1/3877* | (2015.01) | |
| *G06F 3/0346* | (2013.01) | |
| *H02J 7/00* | (2006.01) | |
| *H05K 7/14* | (2006.01) | |
| *B60R 16/02* | (2006.01) | |

(Continued)

(52) U.S. Cl.
CPC ....... *H04B 1/3877* (2013.01); *B60H 1/00642* (2013.01); *B60R 11/0252* (2013.01); *B60R 16/02* (2013.01); *G06F 3/0346* (2013.01); *H02J 7/0042* (2013.01); *H05K 7/14* (2013.01); *B60R 2011/0007* (2013.01); *B60R 2011/007* (2013.01); *B60R 2011/0092* (2013.01)

(58) Field of Classification Search
CPC ... H04M 1/04; H04B 1/3877; B60H 1/00642; B60R 11/0252; B60R 16/02; B60R 2011/0007; B60R 2011/007; B60R 2011/0092; B60R 2011/008; B60R 11/0241; G06F 3/0346; H02J 7/0042; H05K 7/14
See application file for complete search history.

(56) References Cited

U.S. PATENT DOCUMENTS

2012/0229300 A1    9/2012   Fu
2014/0334075 A1*  11/2014   Yamada ............... H05K 5/0017
                                                                361/679.01
(Continued)

FOREIGN PATENT DOCUMENTS

CN       109587312 A       4/2019
DE   102015007247 A1      12/2016

*Primary Examiner* — Tuan D Nguyen
(74) *Attorney, Agent, or Firm* — Maginot, Moore & Beck LLP

(57) ABSTRACT

A method of operating a movable support for orienting and positioning a portable computing device in a vehicle includes supporting the portable computing device with the movable support, and receiving status data based on a status of the vehicle with a controller. The method also includes determining a target orientation of the portable computing device based on the status data with the controller, the target orientation including one of a portrait screen orientation and a landscape screen orientation, and determining a target angular position of the portable computing device based on the status data, the target angular position including one of a driver-oriented position and a passenger-oriented position. The method further includes using the controller to move the movable support to position the portable computing device in the target orientation and the target angular position.

20 Claims, 10 Drawing Sheets

(51) Int. Cl.
  *B60R 11/02* (2006.01)
  *B60H 1/00* (2006.01)
  *B60R 11/00* (2006.01)

(56) References Cited

U.S. PATENT DOCUMENTS

2017/0355382 A1\* 12/2017 Wang ..................... B60Q 3/82
2018/0341289 A1\* 11/2018 Schachter ............... B60R 11/02

\* cited by examiner

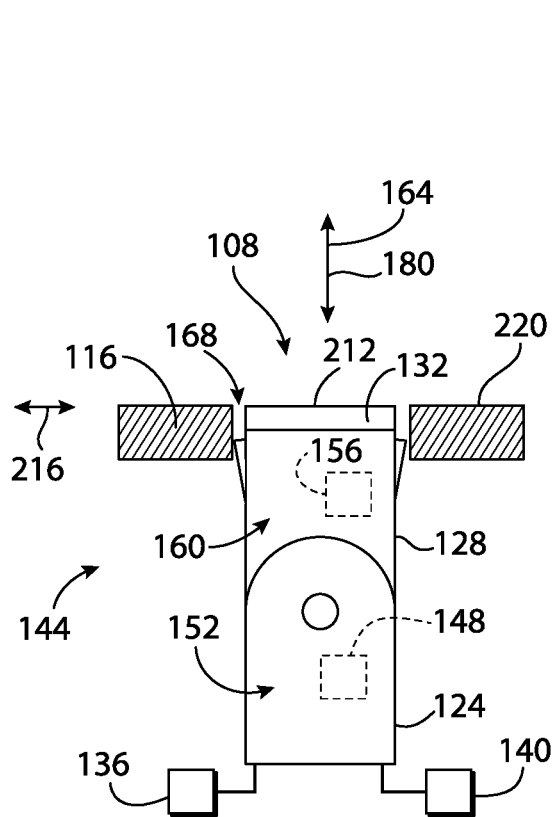
FIG. 2
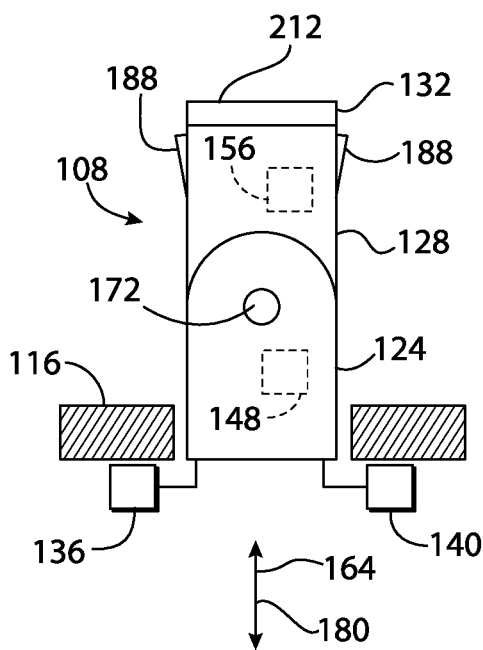
FIG. 3
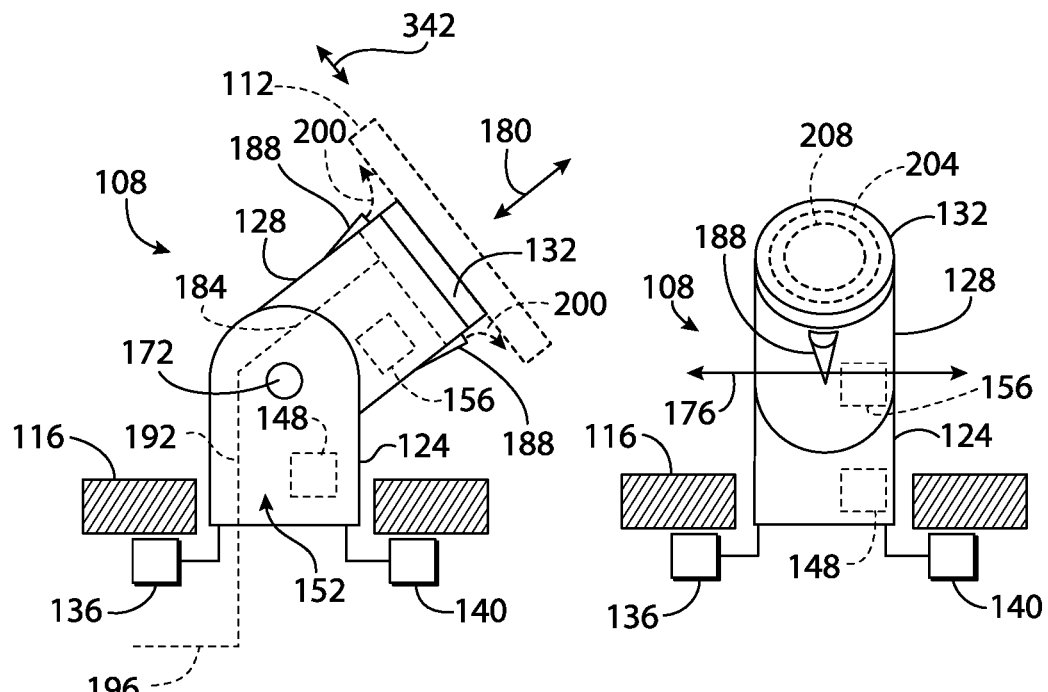
FIG. 4
FIG. 5

SMARTPHONE MOVABLE SUPPORT AND METHOD OF OPERATING A SMARTPHONE MOVABLE SUPPORT

FIELD

This disclosure relates to the field of movable supports and, in particular, to a movable support for automatically positioning and orienting a smartphone in a vehicle.

BACKGROUND

Modern vehicles include infotainment systems that are configured to communicatively connect to a portable computing device, such as a smartphone. For example, a typical vehicle infotainment system includes a vehicle display screen and is configured to display data from a connected smartphone. Many smartphone applications ("apps") enable a connected smartphone to share data with the corresponding vehicle infotainment system. A connected smartphone provides the vehicle infotainment system with increased functionality based on the capabilities of the connected smartphone. In an exemplary usage, a smartphone can transmit navigation data to the vehicle infotainment system, which can then be displayed on the vehicle display screen.

When utilizing the vehicle infotainment system and the connected smartphone, operators find it advantageous to charge the battery of the smartphone and to place the smartphone in a secure location that prevents unwanted movement of the smartphone. Some operators and/or vehicle occupants may also desire to view content directly on the display of the smartphone. Accordingly, operators must manage charging cables and also find a suitable location to place the smartphone. Common solutions include positioning the smartphone in a cup holder or positioning the smartphone in a tray or pocket of the vehicle; however, neither of these positions is desirable. For example, when positioned in a cup holder, the display screen of the smartphone is typically obstructed and limited to the portrait view. Likewise, when positioned in a tray or pocket, the controls of the smartphone are typically inaccessible to the operator and the display screen is typically positioned at an angle that is difficult to view.

Based on the above, there is an opportunity to improve the user experience of utilizing a connected smartphone in a modern vehicle.

SUMMARY

According to an exemplary embodiment of the disclosure, a method of operating a movable support for orienting and positioning a portable computing device in a vehicle includes supporting the portable computing device with the movable support, and receiving status data based on a status of the vehicle with a controller. The method also includes determining a target orientation of the portable computing device based on the status data with the controller, the target orientation including one of a portrait screen orientation and a landscape screen orientation, and determining a target angular position of the portable computing device based on the status data, the target angular position including one of a driver-oriented position and a passenger-oriented position. The method further includes using the controller to move the movable support to position the portable computing device in the target orientation and the target angular position.

According to another exemplary embodiment of the disclosure, a method of operating a movable support for orienting and positioning a portable computing device in a vehicle includes detecting that the portable computing device is supported by the movable support, and identifying content data with the supported portable computing device, the content data corresponding to a content type of an active application operating on the portable computing device. The method also includes determining orientation data based on the content data with the portable computing device, the orientation data corresponding to a target orientation of the supported portable computing device for the content type of the content data, and the target orientation including one of a portrait screen orientation and a landscape screen orientation. The method further includes transmitting the orientation data from the supported portable computing device to a controller, and using the controller to move the movable support to position the portable computing device in the target orientation based on the transmitted orientation data.

According to a further exemplary embodiment of the disclosure, a system includes a vent structure, a cooling system of a vehicle, a movable support, and a controller. The cooling system is operably connected to the vent structure and is configured to selectively supply the vent structure with cooled air. The cooling system cooperates with the vent structure to create at least one path of cooled air. The movable support is configured to support a portable computing device in the at least one path of cooled air. The movable support includes a connection element configured to connect magnetically and electrically to a portable computing device. The controller is operably connected to the cooling system, the movable support, and the portable computing device. The controller is configured to receive temperature data from the portable computing device. The temperature data corresponds to an operating temperature of the portable computing device. The controller is further configured to control the supply of the cooled air to the vent structure based on the temperature data.

BRIEF DESCRIPTION OF THE FIGURES

The above-described features and advantages, as well as others, should become more readily apparent to those of ordinary skill in the art by reference to the following detailed description and the accompanying figures in which:

FIG. 2 is a side view showing a cross-sectional view of an interior structure of the vehicle and showing the movable support in a retracted position;

FIG. 3 is a side view showing a cross-sectional view of the interior structure and showing the movable support in an elevated position;

FIG. 4 is a side view showing a cross-sectional view of the interior structure and showing the movable support in the elevated position with an arm of the movable support moved to an angled position with respect to a pedestal of the movable support;

FIG. 5 is a side view showing a cross-sectional view of the interior structure and showing the movable support in the elevated position with the arm in the angled position and with the pedestal in a rotated position;

DETAILED DESCRIPTION

Figure 1:
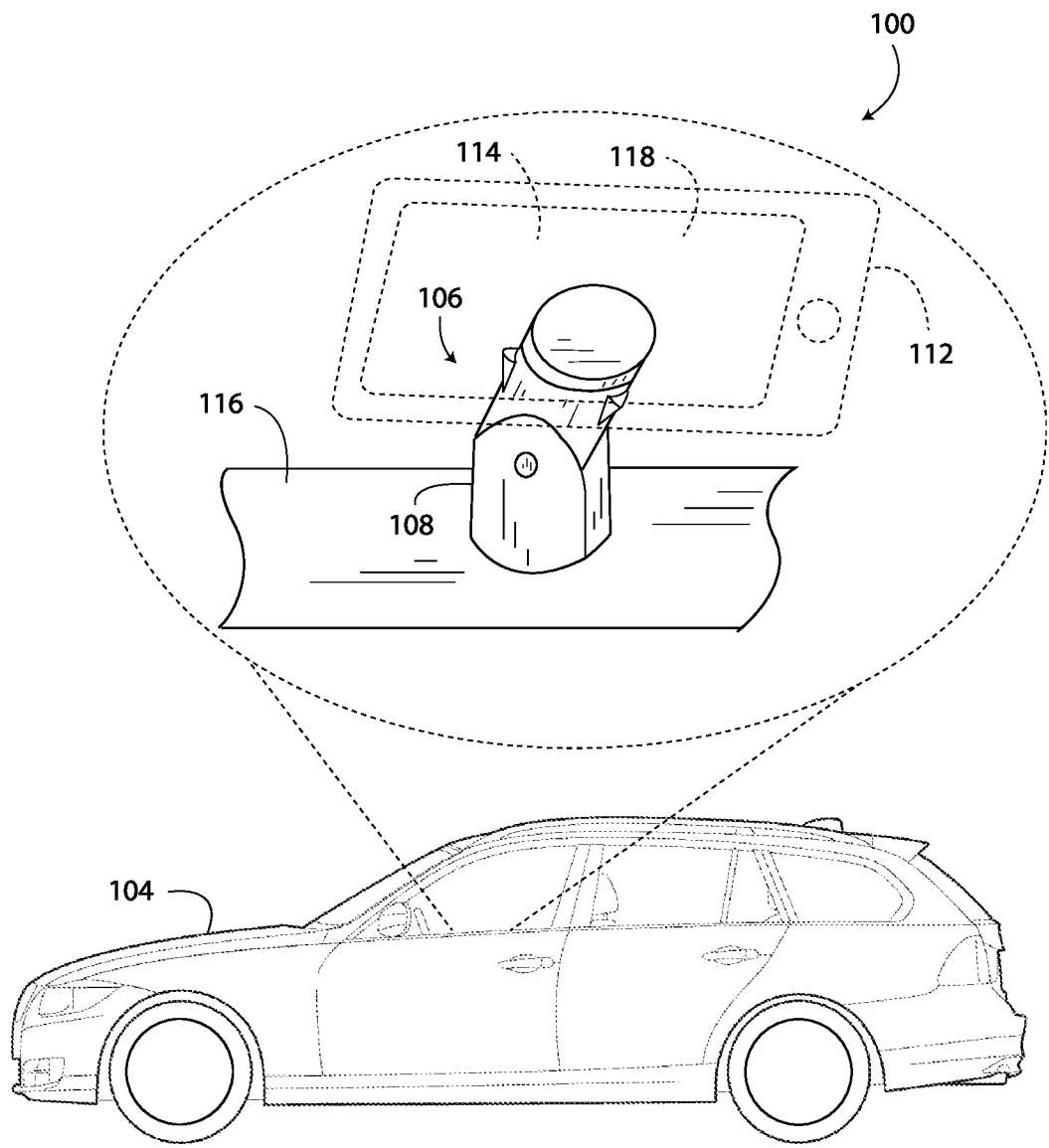
FIG. 1 illustrates a system including a vehicle and a movable support located in an interior cabin of the vehicle, and the enlarged portion illustrates a smartphone supported by the movable support.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

Aspects of the disclosure are disclosed in the accompanying description. Alternate embodiments of the disclosure and their equivalents may be devised without parting from the spirit or scope of the disclosure. It should be noted that any discussion herein regarding "one embodiment," "an embodiment," "an exemplary embodiment," and the like indicate that the embodiment described may include a particular feature, structure, or characteristic, and that such particular feature, structure, or characteristic may not necessarily be included in every embodiment. In addition, references to the foregoing do not necessarily comprise a reference to the same embodiment. Finally, irrespective of whether it is explicitly described, one of ordinary skill in the art would readily appreciate that each of the particular features, structures, or characteristics of the given embodiments may be utilized in connection or combination with those of any other embodiment discussed herein.

The terms "comprising," "including," "having," and the like, as used with respect to embodiments of the disclosure, are synonymous.

As shown in FIG. 1, a system 100 includes a vehicle 104 and a device orientation system 106 that includes a movable support 108. The movable support 108 is configured to support a portable computing device, such as a smartphone 112. As is known, the smartphone 112 includes a display 114 and a corresponding input device 118 that, in one embodiment, includes a touchscreen. In FIG. 1, the smartphone 112 is shown in phantom so that the movable support 108 is more visible. In general, the movable support 108 is removably magnetically connected to a rear surface of the smartphone 112. The movable support 108 is movably mounted to an interior structure 116 of the vehicle 104.

The device orientation system 106 is configured to automatically move the supported smartphone 112 to a target orientation and to a target angular position. Orientation of the smartphone 112 (or other portable computing device) refers to the rotational position of the display 114 about an axis 180 (FIG. 4) generally normal to a screen plane 342 (FIG. 4) of the display 114. The orientation of the smartphone 112 includes at least a portrait screen orientation and a landscape screen orientation. The angular position of the smartphone 112 (or other portable computing device) refers to the rotational position of the movable support 108 and the supported smartphone 112 about an axis 164 (FIG. 4) generally normal to a plane 216 (FIG. 2) of the support surface 116. The angular position of the smartphone 112 and the movable support 108 includes at least a driver-orientated position and a passenger-oriented position.

Figure 12:
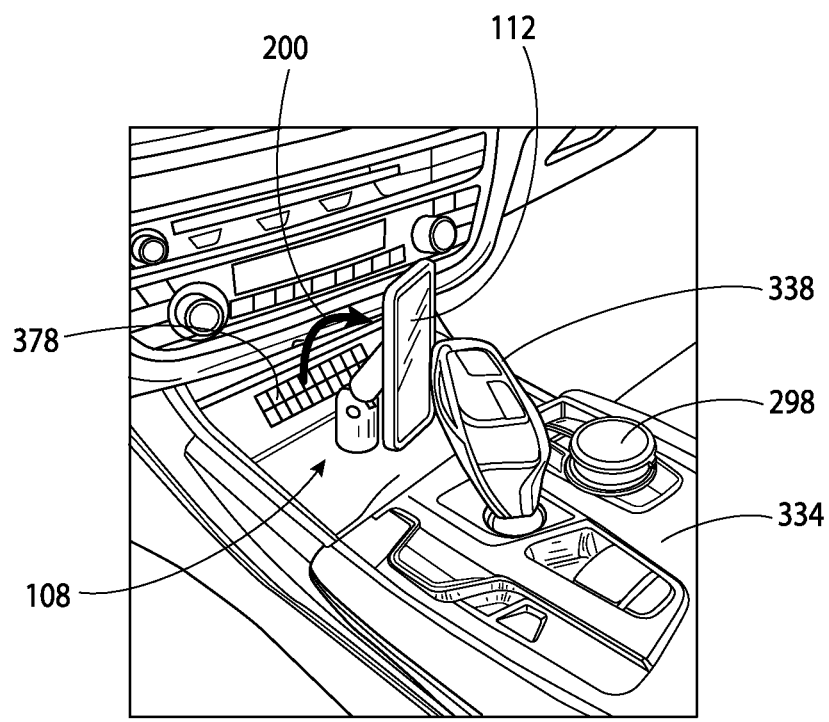
FIG. 12 illustrates the portion of the interior cabin with the movable support supporting the smartphone in a portrait screen orientation and in a passenger-orientation angular position.

As will be discussed below in detail, depending on factors such as a state of the vehicle 104, a mode of the vehicle 104, and active content of the smartphone 112, the system 106 is configured to automatically move the smartphone 112, via the movable support 108, to a target angular position and/or a target orientation. For example, the system 106 can cause the movable support 108 to move the smartphone 112 to the portrait screen orientation (FIG. 12) and/or to rotate the smartphone 112 to the passenger-oriented position (FIG. 12). Accordingly, the device orientation system 106 and the movable support 108 improves the user experience of operating the smartphone 112 in the vehicle 104. Structure of the movable support 108 and methods 500, 600, 700, 800 of operating the system 100 are described herein.

Further detail regarding the movable support 108 is discussed with reference to FIGS. 2-5. FIG. 2 shows a side view of the movable support 108 in a retracted position, and FIG. 3 shows the side view of the movable support 108 in an elevated position. FIG. 4 shows the movable support 108 in a first exemplary angular position, and FIG. 5 shows the movable support 108 in a second exemplary angular position.

As shown in FIGS. 2 and 3, the movable support 108 includes a pedestal 124, an arm 128 operably connected to the pedestal 124, and a connection element 132 operably connected to the arm 128. A lift motor unit 136 and a rotation motor unit 140 are operably connected to the pedestal 124 and are located in a housing 144 defined at least in part by the interior structure 116. The movable support 108 further includes an arm motor unit 148 located in a housing 152 defined by the pedestal 124. The arm motor unit 148 is operably connected to the arm 128. A rotation motor unit 156 of the movable support 108 is located in a housing 160 defined by the arm 128 and is operably connected to the connection element 132. The movable support 108 is a "robotic arm" having multiple degrees of freedom for positioning the smartphone 112 in any target angular position and any target orientation found to be advantageous by the operator and/or the passenger(s) of the vehicle 104.

Referring generally to FIGS. 2-5, the pedestal 124 is movable along a lift axis 164 and is rotatable about the lift axis 164. In particular, rotation of a motor shaft of the lift motor unit 136 is configured to move the pedestal 124 along the lift axis 164 relative to an opening 168 in the interior structure 116 to a target lift position. The pedestal 124 is shown in FIG. 2 in a retracted position and is shown in FIG. 3 in an elevated position. Movement of the pedestal 124 along the lift axis 164 by the lift motor unit 136 also moves the arm 128 and the connection element 132 accordingly. In addition to the lift positions shown in FIGS. 2 and 3, the lift motor unit 136 is configured to position the pedestal 124 at any target lift position between the retracted position (FIG. 2) and the elevated position (FIG. 3).

The rotation motor unit 140 is configured to rotate the pedestal 124 about the lift axis 164. Rotation of a motor shaft of the rotation motor unit 140 rotates the pedestal 124 to any target angular position 360° around the lift axis 164. Rotation of the pedestal 124 also rotates the arm 128 and the connection element 132 accordingly. The pedestal 124 is shown in a first angular position in FIG. 2 and is shown rotated 90° at a second angular position in FIG. 5. The rotation of the pedestal 124 about the lift axis 164 moves the movable support 108 to and between a driver-orientated position (FIG. 1) in which the supported smartphone 112 is positioned for comfortable viewing by a driver of the vehicle 104, and a passenger-orientated position (FIG. 12) in which the supported smartphone 112 is positioned for comfortable viewing by a passenger of the vehicle 104.

As shown in FIGS. 2-5, the motor units 136, 140 are configured for movement with the pedestal 124 along the lift axis 164. In other embodiments, at least one of the lift motor unit 136 and the rotation motor unit 140 has a fixed position within the housing 144 relative to the interior structure 116, and only the pedestal 124 is moved relative to the lift axis 164 upon actuation of the motor units 136, 140. Moreover, in another embodiment, a single motor unit is configured to drive the vertical movement of the pedestal 124 along the lift axis 164 and the rotational movement of the pedestal 124 about the lift axis 164. For example, the single motor unit may include a suitable solenoid that is configured for axial and rotational movement.

The arm 128 is connected to the pedestal 124 at a joint 172 (FIGS. 3 and 4) and is configured for movement about a pivot axis 176 (FIG. 5) that extends through the joint 172. Specifically, rotation of a motor shaft of the arm motor unit 148 is configured to pivot, rotate, and/or move the arm 128 relative to the pedestal 124 about the pivot axis 176 to a target arm position. The pivot axis 176 is perpendicular to the lift axis 164. In one embodiment, the arm 128 is pivotable at least 180° about the pivot axis 176. The arm 128 is shown in FIG. 3 in an upright position in which a main axis 180 of the arm 128 is coaxial with the lift axis 164. The arm 128 is shown in FIG. 4 in a target arm position in which the main axis 180 is pivoted approximately 45° away from the lift axis 164. In addition to the target arm positions shown in FIGS. 3 and 4, the arm motor unit 148 is configured to position the arm 128 at any target arm position from the upright position (FIG. 3) to a target arm position in which the main axis 180 is perpendicular to the lift axis 164.

With reference to FIG. 4, the arm 128 defines an arm air channel 184 operably connected to at least one vent structure 188. The arm 128 includes two of the vent structures 188, but in other embodiments, the arm 128 includes from zero to ten of the vent structures 188. The arm air channel 184 is operably connected to a pedestal air channel 192 extending through the housing 152 of the pedestal 124. The pedestal air channel 192 is operably connected to a main air channel 196 that receives a supply of cooled air and that extends through the housing 144 of the interior structure 116. The vent structures 188 are configured to create at least one path of cooled air 200 that is directed at the smartphone 112 (shown in phantom in FIG. 4).

The connection element 132 is rotatably connected to the arm 128 and is configured for rotation about the main axis 180. Specifically, rotation of a motor shaft of the rotation motor unit 156 is configured to rotate the connection element 132 about the main axis 180 to the target orientation. In one embodiment, the connection element 132 is rotatable 360° about the main axis 180.

As shown in FIG. 5, the connection element 132 includes a mechanical interface 204 and a power interface 208 both of which are shown in phantom. The mechanical interface 204 is configured to operably connect to the smartphone 112 to removably connect the smartphone 112 to the movable support 108. In an exemplary embodiment, the mechanical interface 204 includes at least one magnet that is configured to magnetically connect to a corresponding magnetic structure of the smartphone 112, such as a housing of the smartphone 112, or a case for the smartphone 112 that includes a corresponding magnetic structure. In addition to the magnetic connection, in one embodiment the mechanical interface 204 also includes a "friction interface" provided by a material such as rubber, silicone, and/or a thermoplastic elastomer (TPE).

In one embodiment, the smartphone 112 is connectable to the mechanical interface 204 in only one orientation (i.e. only one rotational position about the axis 180) so that the smartphone 112 is "keyed" to the connection element 132. The "keyed" configuration ensures that the movable support 108 "knows" the orientation of the supported smartphone 112. A connection surface 212 (FIG. 3) of the connection element 132 may include markings or indicia to identify the proper orientation of the smartphone 112 to establish the magnetic connection to the mechanical interface 204.

The position of the supported smartphone 112 may be also be detected electronically. For example, the vehicle 104 may include a camera-based system (not shown) including at least one of a visible-light camera, an infrared camera, and a light detection and ranging system (LIDAR). The camera-based system may be used to generate image data of the supported smartphone 112, which is processed to determine the orientation and/or position of the supported smartphone 112. Additionally or alternatively, the smartphone 112 may generate electronic data (e.g. using an inertial measurement unit (IMU)) that corresponds to the orientation and/or position of the smartphone 112, as supported by the movable support 108.

When the smartphone 112 is connected to the connection surface 212 of the connection element 132, the smartphone 112 moves with the movable support 108. For example, rotation of the connection element 132 is configured to selectively position the smartphone 112 in the landscape screen orientation (FIG. 11) and the portrait screen orientation (FIG. 12). The connection element 132 is configured to strongly connect to the smartphone 112 so that the smartphone 112 is held firmly in a fixed position even when the vehicle 104 traverses rough roadways and when the vehicle 104 is driven spiritedly on twisty roadways. Additionally or alternatively, the connection element 132 includes any other type of mechanical interface 204 configured to securely and to removably connect the smartphone 112 to the movable support 108, such as movable jaws, movable arms, and/or movable clamps.

Additionally or alternatively, the connection element 132 includes an arrangement of at least one electromagnet (not shown) for connecting the smartphone 112 to the movable support 108. The connection element 132, in one embodiment, includes a combined magnetic connection system that includes both permanent magnets (e.g. neodymium magnets) and an array of electromagnets. The permanent magnets provide a connection force (also referred to as a retention force and/or an initial grab) that is sufficient for connecting the smartphone 112 to the movable support 108. The array of electromagnets are configured to provide an electronically controlled additional level of magnetic connection force for connecting the smartphone 112 to the movable support 108. A magnitude of the additional level of magnetic connection force is controlled by the controller 244 and is based on a context of use of the vehicle 104. For example, when an IMU of the vehicle 104 and/or the smartphone 112 detects that the vehicle 104 is accelerating above a threshold level of acceleration, such as when driven on a bumpy road, the controller 244 is configured to increase the magnetic connection force provided by the array of electromagnets of the connection element 132 to maintain the smartphone 112 in the connected configuration and to prevent the smartphone 112 from becoming separated from the movable support 108.

In FIG. 5, the power interface 208 of the connection element 132 is configured to operably connect to the smartphone 112. In particular, the power interface 208 is configured to supply electrical power to the supported smartphone 112 for running applications and for charging a battery of the smartphone 112 with a charging current supplied by the vehicle 104. The power interface 208, in one embodiment, is an inductive power transfer system that transmits electrical power (via the charging current) to the supported smartphone 112 in a "cordless" or "wireless" manner. In a specific embodiment, the power interface 208 and the mechanical interface 204 may suitably be a commercially available magnetic connection and inductive charging system. Additionally or alternatively, the supported smartphone 112 is supplied with electrical power from a wired connection to a power supply of the vehicle 104 that provides the charging current.

In the exemplary embodiment of FIG. 1, the movable support 108 is mounted to the interior structure 116, which, in this embodiment, is a portion of a center console 334 (FIGS. 8-12) of the vehicle 104. In other embodiments, the interior structure 116 is any other structure of the vehicle 104 suitable for supporting the movable support 108, such that a supported smartphone 112 may be viewed and/or used by a driver or passenger of the vehicle 104. For example, the vehicle 104 may include a rear seat center console on which the movable support 108 is mounted. The movable support 108 may also be mounted on a front door and/or a rear door of the vehicle 104. The movable support 108 may further be mounted on a dashboard and/or a vehicle control panel of the vehicle 104. Moreover, the interior structure 116 on which the movable support 108 is mounted may have any angular orientation from horizontal to vertical. The vehicle 104 may include only one of the movable supports 108, or the vehicle 104 may include one of the movable supports 108 for each seating position. In an exemplary embodiment, the vehicle 104 includes four of the movable supports 108 with two of the movable supports 108 positioned for use by front seat occupants and two other movable supports 108 positioned for use by rear seat occupants.

As shown in FIG. 2, in the retracted position, the connection surface 212 of the connection element 132 is located in the plane 216 defined by an outer surface 220 of the interior structure 116. Thus, except for the connection surface 212, the movable support 108 is mostly hidden from view when in the retracted position. Moreover, the connection surface 212, in one embodiment, is configured to blend with or to match the outer surface 220 of the interior structure 116 for a seamless integration into the vehicle 104. In some embodiments, the movable support 108 is not retractable along the axis 164, and the pedestal 124 has a fixed axial position along the axis 164. The pedestal 124 is rotatable about the axis 164 in the non-retractable embodiment.

Figure 6:
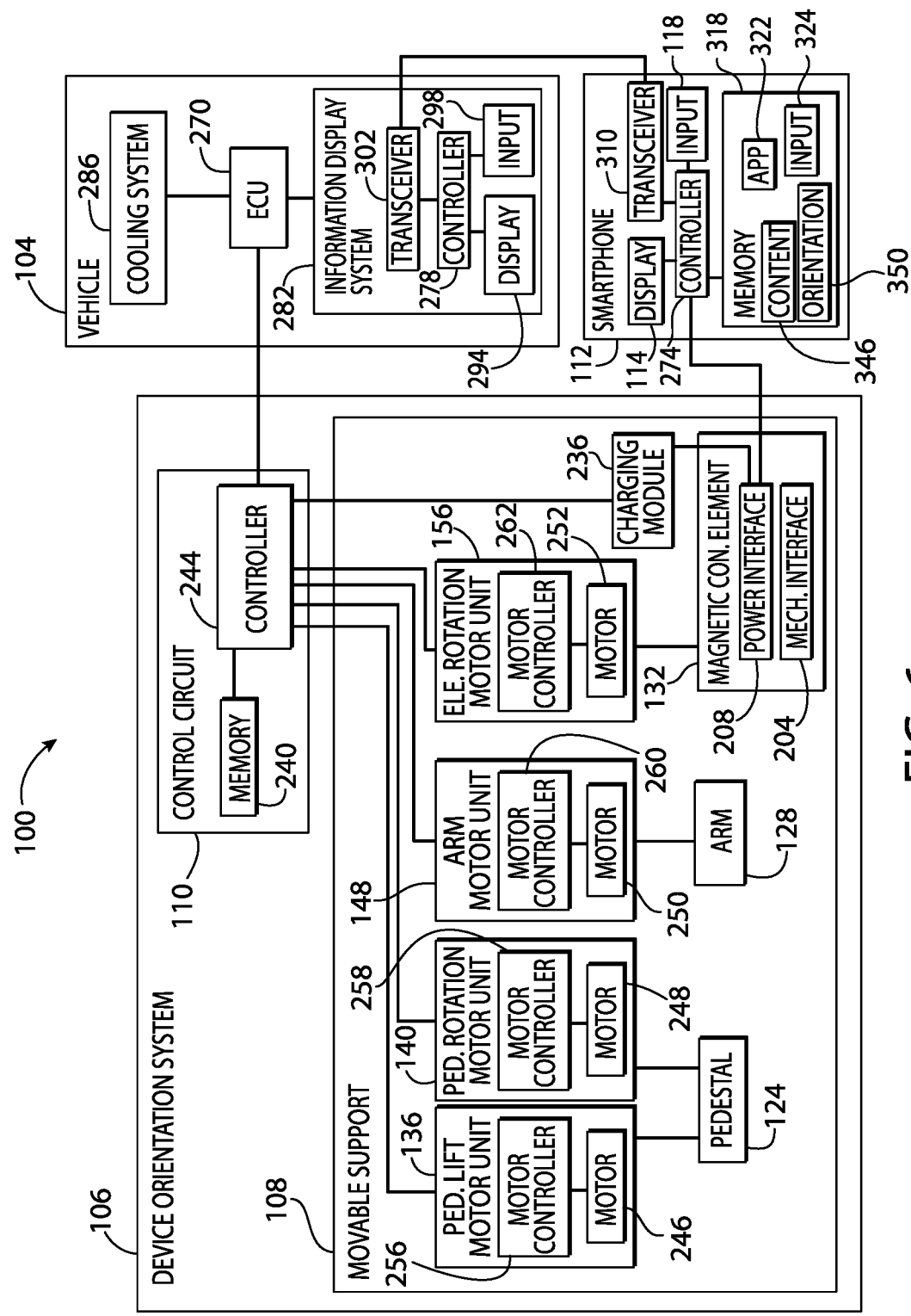
FIG. 6 is a block diagram of the system of FIG. 1.

FIG. 6 shows a schematic block diagram of an exemplary embodiment of the system 100, including the device orientation system 106, the smartphone 112, and the vehicle 104. The device orientation system 106 includes a control circuit 110 in addition to the movable support 108.

The control circuit 110, which is operably connected to the movable support 108, includes a controller 244 and a memory 240. The controller 244 in this embodiment is a programmable processing device that performs various operations described herein by executing programming instructions stored in the memory 240. The controller 244 may suitably comprise at least one microprocessor and/or microcontroller and is operably connected to an electronic control unit (ECU) 270 of the vehicle 104.

The memory 240 includes at least one non-transitory storage medium storing the programming instructions, and other data as described herein.

Each of the pedestal lift motor unit 136, the pedestal rotation motor unit 140, the arm motor unit 148, the connection element rotation motor unit 156, a charging module 236, and a memory 240 is operably connected to a controller 244 of the control circuit 110. Each motor unit 136, 140, 148, 156 includes a corresponding electric motor 246, 248, 250, 252 operably connected to a corresponding motor controller 256, 258, 260, 262. In an embodiment, the pedestal lift motor unit 136 includes a first pedestal motor 246 operably connected to the pedestal 124 and configured to move the pedestal 124 along the lift axis 164 (FIG. 2). The pedestal rotation motor unit 140 includes a second pedestal motor 248 operably connected to the pedestal 124 and configured to rotate the pedestal 124 about the lift axis 164 (FIG. 2). The arm motor unit 148 includes an arm motor 250 operably connected to the arm 128 and configured to move the arm 128 relative to the pedestal 124 about the pivot axis 176 (FIG. 5). The connection element rotation motor unit 156 includes an element motor 252 operably connected to the connection element 132 and configured to rotate the connection element 132 about the main axis 180 (FIG. 4). The electric motors 246, 248, 250, 252, in one embodiment, are servomotors that provide precise rotational and positional control of the pedestal 124, the arm 128, and the connection element 132. In other embodiments, the motors 246, 248, 250, 252 may suitably be other position controllable electric motors including, but not limited to, stepper motors, brushed DC motors, and brushless DC motors.

The motor controllers 256, 258, 260, 262 in this embodiment are integrated with the respective motors 246, 248, 250, 252 in the motor units 136, 140, 148, 156. The motor controllers 256, 258, 260, 262 are configured to receive electronic signals (i.e. position signals) from the controller 244 of the control circuit 110 for selectively activating the motors 246, 248, 250, 252 in order to automatically move corresponding portions of the movable support 108 to a target angular position and a target orientation. The motor controllers 256, 258, 260, 262 and the motors 246, 248, 250, 252 are operably connected to a suitable power supply (not shown) of the vehicle 104, such as a battery.

The motor controller 256 is configured to generate a lift signal configured to cause a motor shaft of the pedestal motor 246 to rotate, thereby positioning the pedestal 124 in any target lift position along the axis 164 (FIG. 2). The motor controller 258 is configured to generate a rotation signal configured to cause a motor shaft of the pedestal motor 248 to rotate, thereby positioning the pedestal 124 in any target angular position about the axis 164 (FIG. 2). The motor controller 260 is configured to generate a pivot signal configured to cause a motor shaft of the arm motor 250 to rotate thereby positioning the arm 128 in any target arm position about the pivot axis 176 (FIG. 5). The motor controller 262 is configured to generate a rotation signal configured to cause a motor shaft of the element motor 252 to rotate thereby positioning the connection element 132 in any target rotational position about the main axis 180 (FIG. 4).

In one embodiment, the pedestal 124, the arm 128, and/or the connection element 132 are moved by electromechanically driven tendons (not shown) including, but not limited to, wires and cables. The tendons operably connect the pedestal 124, the arm 128, and/or the connection element 132 to a corresponding motor. Using a tendon-based construction typically reduces the size of the movable support 108 as compared to supporting the motor units 136, 140, 148, 156 within the movable support 108. As a further embodiment, movement of the pedestal 124, the arm 128, and/or the connection element 132 is provided by pneumatic bladders, soft-robotics, and/or smart materials.

In FIG. 6, the charging module 236 is operably connected to the connection element 132 and to the controller 244 of the control unit 110. Specifically, the charging module 236 is operably connected to the power interface 208 of the connection element 132. The charging module 236 is configured to supply the power interface 208 with the charging current from the vehicle 104 that is provided to the supported smartphone 112 through the power interface 208. The charging module 236, in one embodiment, is operably connected to a battery of the vehicle 104 to receive electrical power for generating the charging current. When the smartphone 112 is connected to the mechanical interface 204, the smartphone 112 is positioned to receive the charging current through the power interface 208 from the charging module 236.

In general, the controller 244 is configured to cause the movable support 108 to position a supported smartphone 112 in any of a plurality of target orientations and target angular positions. To this end, the controller 244 is configured and operably connected as described above to provide suitable signals to activate the motor units 136, 140, 148, 156 to cause the movable support 108 to position the smartphone 112 in a target orientation and/or a target angular position.

As shown in FIG. 6, the vehicle 104 includes a cooling system 286 and the center information display system 282 operably connected to the ECU 270. The cooling system 286, which is also referred to herein as a climate control system and a heating ventilation and cooling (HVAC) system is configured to regulate a temperature of an interior cabin of the vehicle 104. The cooling system 286 is operably connected to the device orientation system 106 and is configured to selectively supply the vent structures 188 (FIG. 4) with cooled air via the main air channel 196 (FIG. 4). Specifically, the cooling system 286 selectively supplies the main air channel 196 with cooled air. The pedestal air channel 196 and the arm air channel 184 are configured to direct the cooled air from the main air channel 196 to the vent structures 188, which are configured to create the at least one path of cooled air 200 for cooling the supported smartphone 112.

The information display system 282 of the vehicle 104 includes a display screen 294, an input device 298, and a transceiver 302 operably connected to a controller 278. The information display system 282 is also referred to herein as an in-vehicle infotainment system. The display screen 294, in one embodiment, is a liquid crystal display (LCD) panel configured to render and to display text, images, and other user sensible outputs and visually comprehensible data. For example, the display screen 294 is configured to render data, such as a graphical user interface (GUI) for controlling the information display system 282, the cooling system 286, the movable support 108, and/or the smartphone 112. The display screen 294 is further configured to display digital content from the smartphone 112, such as navigation data, for example. The display screen 294 is also configured to mirror the display 114 of the smartphone 112.

The input device 298 is a touchscreen applied over the display screen 294 that is configured to respond to the touch of a finger or a stylus by generating user input data. In another embodiment, the input device 298 includes at least one button that is configured to generate input data when touched or moved by a user. In yet another embodiment, the input device 298 is any device configured to generate an input signal and/or input data, as desired by those of ordinary skill in the art.

As shown in FIG. 6, the transceiver 302 of the information display system 282 is operably connected to the ECU 270 and to a transceiver 310 of the smartphone 112. The transceiver 302 in one embodiment is configured for the wired and/or wireless exchange of data with the smartphone 112. For example, the transceivers 302, 310 may exchange data using Wi-Fi, Bluetooth®, near-field communication (NFC), ultra-wide band (UWB), and/or any other wireless network protocol.

The controller 278 of the information display system 282, in one embodiment, is a programmable processing device that performs various operations described herein by executing programming instructions stored in a memory. The controller 278 may suitably comprise at least one microprocessor and/or microcontroller and is operably connected to the ECU 270.

The ECU 270, which is also referred to herein as an electronic control module (ECM), includes at least one microprocessor and/or controller configured to control systems of the vehicle 104, such as the cooling system 286, the information display system 282, a seat positioning system (not shown), and/or a motor operation system (not shown). In one embodiment, a controller area network (CAN bus) operably connects the ECU 270 to the systems of the vehicle 104 including the device orientation system 106.

In FIG. 6, the smartphone 112 includes the transceiver 310, the display 114, the input device 118, and a memory 318 operably connected to a controller 274. As discussed above, the smartphone 112 is one example of a commonly available portable computing device that may be used in conjunction with the system 100. As used herein, the term "portable computing device" includes, but is not limited to, all types and brands of smartphones, cell phones, cellular phones, flip phones, phones, portable global positioning system (GPS) devices, portable navigation devices, and tablet computers. The smartphone 112 may utilize any mobile operating system. The portable computing device also includes propriety display screen devices that are vehicle and/or manufacturer specific. In such an embodiment, the movable support 108 is configured to position the supported portable computing device for viewing in any suitable seating position, including a flat seating position for resting or sleeping.

The transceiver 310, as noted above, is operably connected to the transceiver 302 of the information display system 282, and is configured for the wired and/or wireless exchange of data with the information display system 282.

The display 114 of the smartphone 112, in one embodiment, is a liquid crystal display (LCD) panel configured to render and to display text, images, and other user sensible outputs and visually comprehensible data. For example, the display 114 is configured to render data, such as a GUI for controlling the smartphone 112, the movable support 108, and/or the information display system 282.

The input device 118, as described above, is a touchscreen applied over the display 114 that is configured to respond to the touch of a finger or a stylus by generating user input data 324. In another embodiment, the input device 118 includes at least one button that is configured to generate input data when touched or moved by a user. In yet another embodiment, the input device 118 is any device configured to generate an input signal and/or input data 324, as desired by those of ordinary skill in the art.

The memory 318 of the smartphone 112 is a non-transitory computer readable storage medium that is configured to store data for operating movable support 108 and the smartphone 112. The memory 318 is configured to store app data 322 and the input data 324 and any other data for operating or controlling the smartphone 112.

The controller 274 of the smartphone 112 includes at least one microprocessor and/or microcontroller and is configured to generate data, as described herein, for controlling the smartphone 112, the movable support 108, and the information display system 282. The controller 274 is configured to run applications (i.e. "apps") stored as the app data 322.

In the illustrated embodiment, the device orientation system 106 includes the control circuit 110 and the controller 244 that is configured to control movement of the pedestal 124, the arm 128, and the connection element 132. In another embodiment, the movable support 108 does not include the control circuit 110 and the controller 244, and the ECU 270 is configured to perform many or all of operations of the controller 244 described herein. In yet other embodiments, some or all of the operations of the controller 244 described herein may be performed by the controller 274 of the smartphone 112 and/or the controller 278 of the information display system 282. In a further embodiment, the control circuit 110 is included in the vehicle 104 and/or the smartphone 112.

Figure 8:
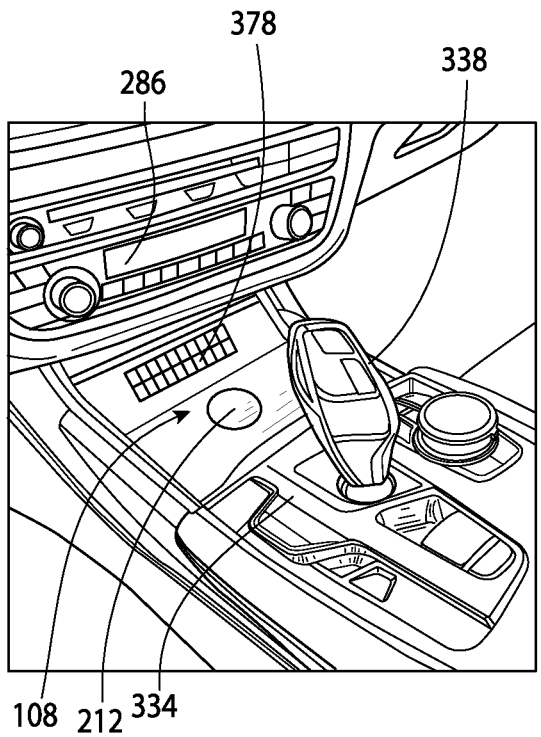
FIG. 8 illustrates a portion of the interior cabin of the vehicle with the movable support in the retracted position and the smartphone disconnected from the movable support.
Figure 9:
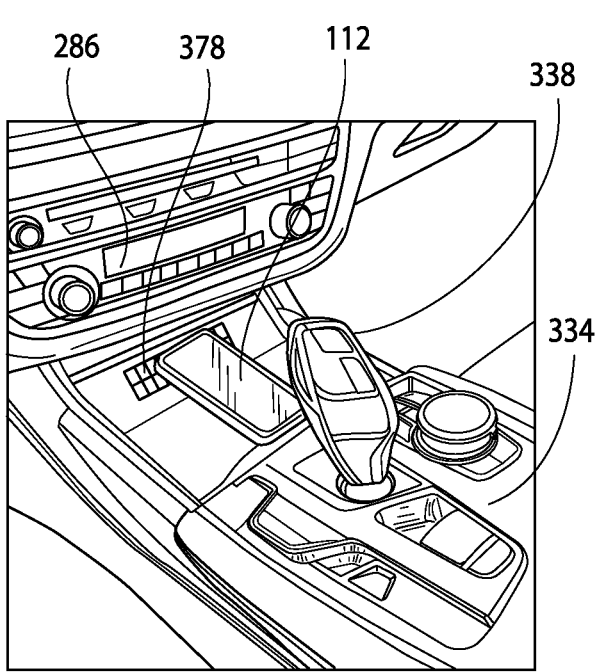
FIG. 9 illustrates the portion of the interior cabin with the movable support in the retracted position and the smartphone connected to the movable support.

In operation, the movable support 108 is configured to conveniently support the smartphone 112 within the vehicle 104 in a target orientation and a target angular position. An exemplary usage case of the system 100 is described with reference to FIGS. 8-12. As shown in FIG. 8, the interior structure 116 is a portion of the center console 334 including a gear selector 338 of the vehicle 104. The movable support 108 is available for use by a driver or a front passenger of the vehicle 104. When the operator enters the vehicle 104, the movable support 108 is in the retracted position, as shown in FIG. 8 (also shown in FIG. 2). As the operator readies herself for the journey, she typically places her smartphone 112 onto the movable support 108 so that the connection element 132 connects to the smartphone 112, as shown in FIG. 9. In FIG. 9, the movable support 108 is in the retracted position, but the connection element 132 is connected to the smartphone 112, typically magnetically, because the connection surface 212 is in the plane 216 (FIG. 2). Thus in FIG. 9, the mechanical interface 204 and the power interface 208 are connected to the smartphone 112.

Figure 10:
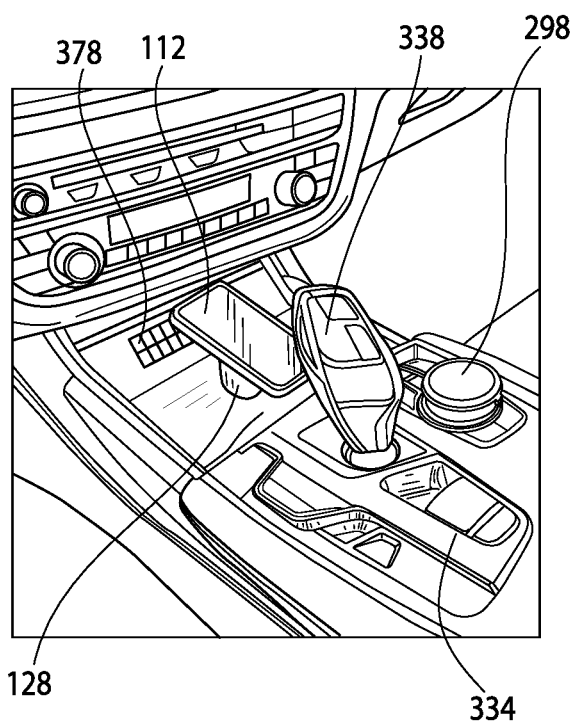
FIG. 10 illustrates the portion of the interior cabin with the movable support in the elevated position and the smartphone connected to the movable support.

With reference to FIG. 10, the operator transitions the vehicle 104 from an off state to an accessory state or an operational state, using a vehicle start button, a key, or the like. As will be discussed below, the controller 244, responsive to detection of the state change, causes the movable support 108 to automatically move to the elevated position (also shown in FIG. 3). The orientation of the smartphone 112 in FIG. 10 is also referred to herein as a flat screen orientation in which the screen plane 342 (FIG. 4) of the smartphone 112 is substantially horizontal. As used herein, "substantially horizontal" is within plus or minus 5° of horizontal. In the off state, most vehicle systems are not electrically powered and a motor (not shown) of the vehicle 104 cannot be activated for moving the vehicle 104. In the accessory state, most vehicle systems are electrically powered but the vehicle motor (not shown) cannot be activated for moving the vehicle 104. In the operational state, the vehicle systems are electrically powered and the motor of the vehicle 104 can be activated for moving the vehicle 104. In the flat screen orientation of FIG. 10, with the vehicle 104 in the accessory state or the operational state, the smartphone 112 automatically connects to the information display system 282 via data transmission by the transceivers 302, 310 (FIG. 6). The connection between the smartphone 112 and the information display system 282 is by Bluetooth or Wi-Fi, for example. Accordingly, in the flat screen orientation, data is exchangeable between the smartphone 112, the information display system 282, and the movable support 108.

After automatically moving to the flat screen orientation, the controller 244 causes the support device 108 to move the smartphone 112 to a default screen orientation. The default screen orientation is either the landscape screen orientation (FIG. 11) or the portrait screen orientation (FIG. 12). The default screen orientation is configurable by the user and may be saved to the memory 240.

The operator then drives the vehicle 104 or is driven by the vehicle 104. The operator may be a driver of the vehicle 104, a passenger in the vehicle 104, or a user of the vehicle 104 when the vehicle 104 is an autonomous vehicle or an automated vehicle. The operator may interact with the smartphone 112 through the information display system 282 and may also interact with the information display system 282 through the smartphone 112. The device orientation system 106 conveniently supports the smartphone 112 and automatically charges the battery of the smartphone 112 as appropriate.

When the operator completes a journey and powers down the vehicle 104, the controller 244 causes the movable support 108 to move the smartphone 112 to the flat screen orientation of FIG. 10. In the flat screen orientation, the operator can easily and comfortably grasp the smartphone 112 to separate the smartphone 112 from the connection element 132. In one embodiment, the user simply pulls on the smartphone 112 to overcome the magnetic connection between the smartphone 112 and the mechanical interface 204 in order to separate the smartphone 112. In some embodiments, the controller 244, via elements or sensors on the movable support 108, detects that the smartphone 112 has been separated from the connection element 132, and causes the movable support 108 to move to the retracted position of FIG. 8 so that the movable support 108 is mostly hidden from view when the vehicle 104 is not in operation.

Method of Automatically Orienting the Smartphone Based on Content Data

Figure 13:
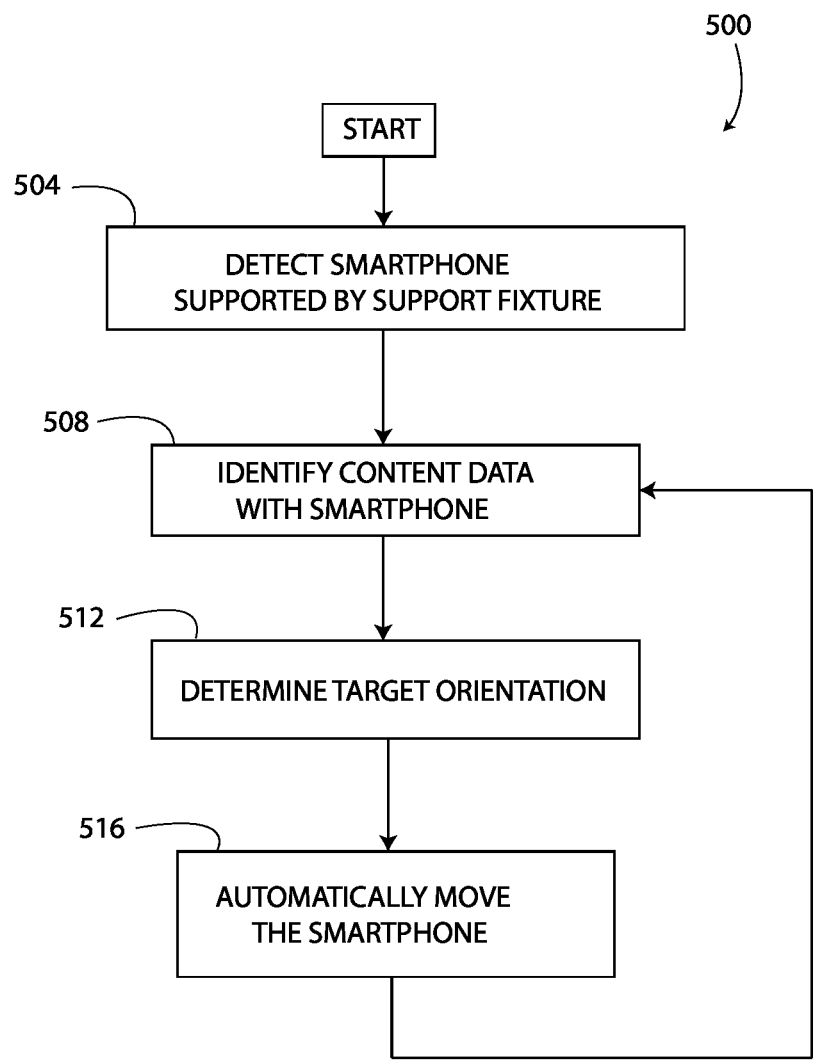
FIG. 13 is a flowchart illustrating an exemplary method of operating the system of FIG. 1 based at least on content data.

With reference to FIG. 13, a method 500 of operating the movable support 108 is disclosed. The method 500 describes automatically orienting the smartphone 112 in the target orientation based on content data 346 (FIG. 6) corresponding to an active application on the smartphone 112. It will be appreciated that the operations of the controller 244 as described below are, in this embodiment, carried out by the controller 244 executing program instructions stored in the memory 240. Operations ascribed to the smartphone 112 may suitably be carried out by the controller 274 (see FIG. 6) executing an app stored in the app data 322.

In block 504, the method 500 includes detecting that the smartphone 112 is supported by the movable support 108. In one embodiment, detection of the smartphone 112 occurs when the system 100 is configured as shown in FIG. 10, and the operator opens an app on the smartphone 112 to display a GUI on the display 114. Then the operator uses the input device 118 to generate the input data 324 by touching a "button" of the GUI to indicate that use of the movable support 108 is desired. The smartphone 112 transmits a first "smartphone supported signal" to the transceiver 302 of the information display system 282 based on the input data 324. In response, to receiving the first smartphone supported signal, the information display system 282 sends a second "smartphone supported signal" based on the input data 324 to the controller 244 via the ECU 270. When the controller 244 receives the second smartphone supported signal, the smartphone 112 is detected and data is exchangeable between each of the smartphone 112, the movable support 108, and the information display system 282.

In another embodiment, instead of using the input device 118 of the smartphone 112 to begin the detection process, the operator configures the smartphone 112 as shown in FIG. 10 and then uses the input device 298 of the information display system 282 to indicate that the smartphone 112 is connected to the movable support 108. In one embodiment, the operator touches a "button" of a GUI shown on the display 294 to indicate that use of the movable support 108 is desired. After receiving the user input, the information display system 282 transmits a first "smartphone supported signal" to the controller 244 of the control circuit 110. Moreover, the information display system 282, in one embodiment, transmits a second "smartphone supported signal" to the smartphone 112 via the transceivers 302, 310. When the controller 244 receives the first smartphone supported signal and the smartphone 112 receives the second smartphone supported signal, the smartphone 112 is detected and data is exchangeable between each of the smartphone 112, the movable support 108, and the information display system 282.

In a further embodiment, detecting that the smartphone 112 is supported by the movable support 108 occurs automatically when the operator magnetically connects the smartphone 112 to the connection element 132. Specifically, with the smartphone 112 positioned as shown in FIG. 10, the controller 244 detects that the smartphone 112 is connected to the power interface 208 and is available to receive electrical energy from the charging module 236. In particular, the controller 244 monitors a current flow from the charging module 236 to the smartphone 112 to detect that the smartphone 112 is connected to the mechanical interface 204.

With reference again to the flowchart of FIG. 13, in block 508 the method 500 includes identifying content data 346 on the supported smartphone 112. In one embodiment, the smartphone 112 includes a background app (stored as the app data 322) that is configured to detect the content type of an active application (also stored as the app data 322). For example, with the smartphone 112 in the default screen orientation of FIG. 11, the operator uses the input device 118 of the smartphone 112 to select an active application, such as a social media app or a text messaging app. When the user selects the active application, the background app matches the active application to a corresponding content type and saves the content type as the content data 346 to the memory 318. Typically, the active application is an application selected by the user of the smartphone 112 for display on the display 114. In one embodiment, the active application is an application displaying content on a majority of the display 114 of the smartphone 112. The background app includes a digital list of apps that are available to the smartphone 112 and the corresponding content type of each app in the list. In one embodiment, the content type is selected from the following types including, but not limited to, movie content, music content, navigation content, communication content, or social media content. The background app, in one embodiment, has a corresponding GUI but typically execution of the background app is not noticed by the operator, to provide a seamless user experience of the movable support 108.

Next, at block 512 of the method 500, the smartphone 112 determines orientation data 350 (FIG. 6) corresponding to the target orientation based on the content data 346. In particular, each content type has a corresponding screen orientation that is saved as the orientation data 350. For example, the orientation data 350 for the movie content and the navigation content correspond to the landscape screen orientation. The orientation data 350 for the music content, the communication content, and the social media content correspond to the portrait screen orientation. The orientation data 350 for a note-taking app, in which the operator draws or writes on the display 114 with a corresponding stylus or their finger, corresponds to the flat screen orientation. The target orientation for the active application is determined by matching the content type of the content data 346 to the corresponding screen orientation of the content data 346. The target orientation is saved as the orientation data 350.

After the orientation data 350 is determined, the supported smartphone 112 transmits the orientation data 350 to the information display system 282 using the transceivers 302, 310. Then, the information display system 282 transmits the orientation data 350 to the controller 244. The controller 244, in one embodiment, saves the orientation data 350 to the memory 240. In another embodiment, the orientation data 350 is transmitted directly to the controller 244.

Figure 11:
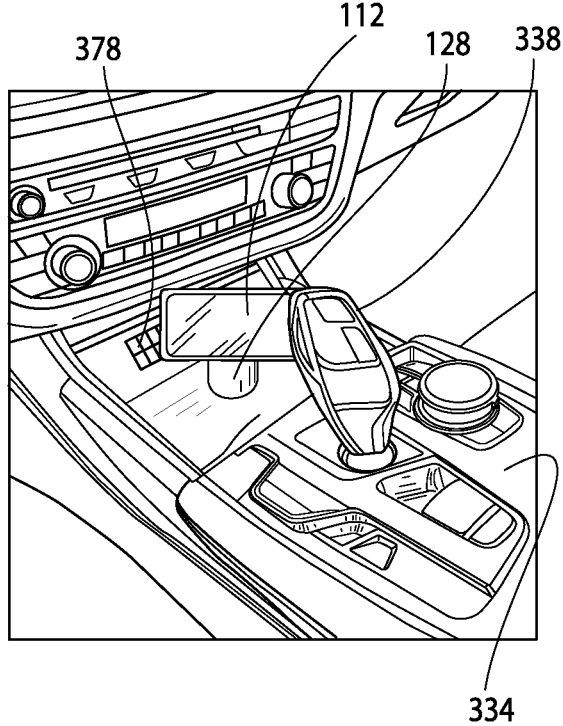
FIG. 11 illustrates the portion of the interior cabin with the movable support supporting the smartphone in a landscape screen orientation and in a driver-oriented angular position.

At block 516 of the method 500, the controller 244 processes the orientation data 350 and causes the movable support 108 to position the smartphone 112 in the target orientation based on the orientation data 350. As discussed above, the controller 244 provides suitable signals to activate the motor units 136, 140, 148, 156 to cause the movable support 108 to position the smartphone 112 in the target orientation. To continue the example from above, consider the smartphone 112 positioned as shown in FIG. 11 in the landscape screen orientation. Consider also that the user selects the active application as a social media application. The background application on the smartphone 112 determines the content data 346 by identifying the content type of the active application and also determines the orientation data 350 based on the content data 346 to identify the target orientation (steps 508 and 512). In the example of the social media application, the target orientation is the portrait screen orientation. The smartphone 112 sends the orientation data 350 directly or indirectly to the controller 244. The controller 244, in step 516, causes the movable support 108 to move from the landscape screen orientation of FIG. 11 to the portrait screen orientation of FIG. 12. The operator, therefore, need not manually adjust the orientation of the supported smartphone 112 to match the desired orientation for the active application. Instead, the movable support 108 automatically rotates the smartphone to change the orientation based on the content type of the active application.

Figure 7:
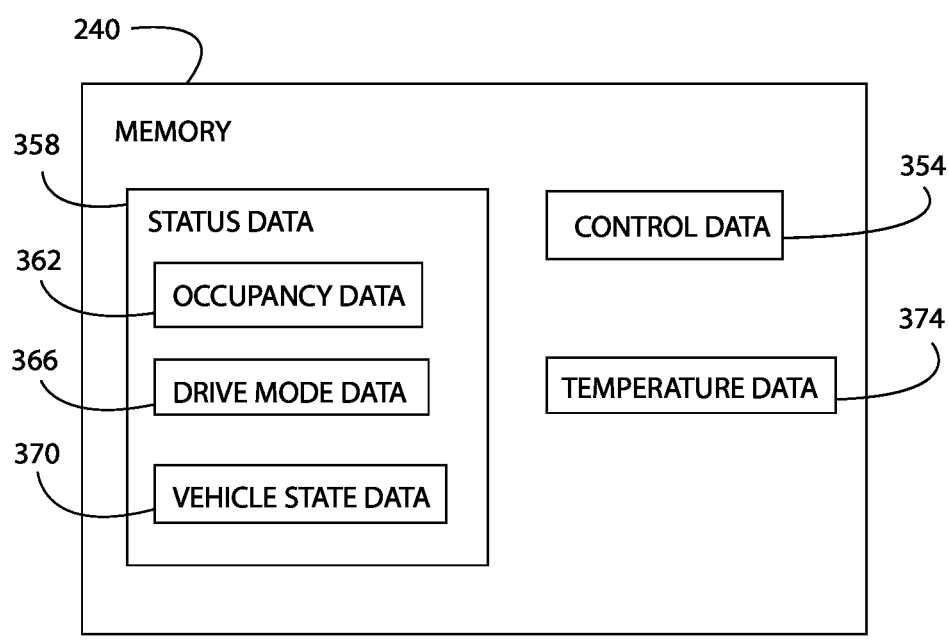
FIG. 7 is a block diagram of a memory of a control circuit of the system.

In some embodiments, the information display system 282 generates control data 354 (FIG. 7) that is used to control the orientation of the smartphone 112. For example, the operator of the vehicle 104 uses the input device 298 to select a feature of the information display system 282, such as navigation guidance. When navigation guidance is selected, the information display system 282 generates the control data 354 and transmits the control data 354 to the controller 244, which stores the control data 354 in the memory 240. The control data 354 corresponds a vehicle-controlled orientation of the smartphone 112 because the information display system 282 controls the orientation of the smartphone 112 instead of the active application on the smartphone 112. In the example of navigation guidance, the vehicle-controlled orientation is the landscape screen orientation. In response to receiving the control data 354, the movable support 108 automatically moves the smartphone 112 to position the smartphone 112 in the vehicle-controlled orientation. Thus, the movable support 108 is configured to automatically adjust the orientation of the smartphone 112 based on control data 354 from the in-vehicle information display system 282 as well as from orientation data 350 from the smartphone 112.

As shown at block 516, after automatically moving the smartphone 112 with the movable support 108, the method 500 includes returning to block 508 to identify again the content data 346. The orientation of the smartphone 112 may thus be continually updated and/or changed based on the current active application on the smartphone 112.

According to the method 500, the rotational orientation of the smartphone 112 is intelligently controlled by the support device 108 to optimize the display of content for the operator. Most smartphone apps have a preferred screen orientation for the optimal display of the data/GUI. With known in-vehicle smartphone supports, the user must manually and frustratingly rotate the smartphone and the support structure each time a different orientation is desired. Such an approach is inconvenient and can be a distraction to the driver/operator of the vehicle 104. The movable support 108 provides an automatic orientation adjustment of the smartphone 112 that is based on the optimal orientation for viewing the data of the active application. The movable support 108 is, therefore, particularly well-suited for in-vehicle use because the driver/operator is free to concentrate on the road instead of manually adjusting the position of the supported smartphone 112.

In one embodiment, the active application (i.e. app) is associated with multiple orientations of the smartphone 112, and the movable support 108 is configured to change the orientation of the smartphone 112 depending on the content that is displayed on the display 114. For example, when the active application is the navigation content, the active application may display a listing of turns and/or a direction of travel that results in the generation of control data 354 that causes the movable support 108 to position the smartphone 112 in the portrait screen orientation. Additionally, when the active application is the navigation content, the active application may display a map view that results in the generation of control data 354 that causes the movable support 108 to position the smartphone 112 in the landscape screen orientation.

Additionally or alternatively, the orientation and/or position of the smartphone 112 is controlled to optimize the view of a camera (not shown) of the smartphone 112. In such an embodiment, the movable support 108 is configured to rotate the smartphone 112 about the axis 164 to point the camera of the smartphone 112 at the person (i.e. driver or passenger) that is speaking. The movable support 108 is further configured to select the orientation of the smartphone 112 based on the number and/or the position of the person/people in a field of view of the camera of the smartphone 112.

Figure 14:
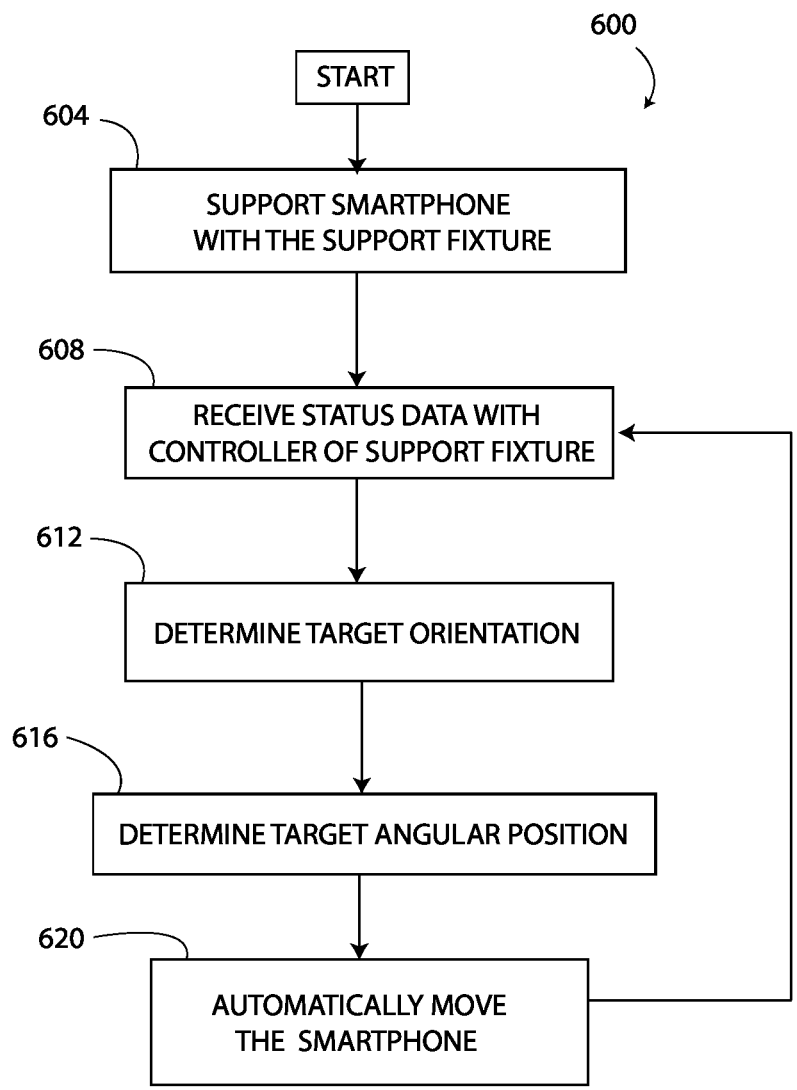
FIG. 14 is a flowchart illustrating an exemplary method of operating the system of FIG. 1 based at least on status data.

Method of Automatically Orienting and Positioning the Smartphone Based on Vehicle Status Data With reference to FIG. 14, a method 600 of operating the movable support 108 automatically orients and positions the smartphone 112 based on status data 358 (FIG. 7) corresponding to a status of the vehicle 104. In block 604, the method 600 includes supporting the smartphone 112 with the movable support 108.

Next, at block 608 the method 600 includes receiving status data 358 based on a status of the vehicle 104 with the controller 244. The status data 358 is stored in the memory 240 The status data 358 includes, but is not limited to, occupancy data 362, vehicle state data 366, and drive mode data 370. The occupancy data 362 corresponds to a seating location of the operator of the smartphone 112 within the vehicle 104. In one embodiment, the occupancy data 362 is provided by the operator using the input 118 of the smartphone 112 and/or the input 298 of the information display system 282. For example, upon supporting the smartphone 112 with the movable support 108, the GUI on the display 114 of the smartphone 112 and/or the display 294 of the information display system 282, may request the operator to identify their seating position within the vehicle 104. The information provided by the operator is saved as the occupancy data 362 in the memory 240. In other embodiments, the occupancy data 362 is automatically generated without operator input using sensors in the vehicle seats, cameras within the vehicle cabin, and/or a camera of the smartphone 112. In an example, the occupancy data 362 identifies that the operator of the smartphone 112 is located at one of a driver-seating position of the vehicle 104 and a passenger-seating position of the vehicle 104.

The vehicle state data 370 of the status data 358 identifies the vehicle 104 as being in the off state, the accessory state, or the operational state.

The drive mode data 366 of the status data 358 identifies the vehicle 104 as being in a park mode, an operator-drive control mode, or an automated-drive control mode. In the park mode, a transmission of the vehicle 104 is configured in "park" and the vehicle 104 is stationary. In the operator-drive control mode, the transmission of the vehicle 104 is in "drive" and the operator is controlling the steering angle, the acceleration, and the braking of the vehicle 104. In the automated-drive control mode, at least one automated system of the vehicle 104 is controlling at least one of the steering angle, the acceleration, and the braking of the vehicle 104.

At block 612 of the method 600, the controller 244 determines a target orientation of the smartphone 112 based on the status data 358. In one embodiment, the target orientation is determined by the controller 244 to be the flat screen orientation when the drive mode data 366 corresponds to the operator-drive control mode. Additionally, the controller 244 determines that the target orientation is one of the portrait screen orientation and the landscape screen orientation when the drive mode data 366 corresponds to the park state or the automated-drive control mode.

In another embodiment at block 612, the controller 244 determines the target orientation as the flat screen orientation when the vehicle state data 370 corresponds to the off state. Additionally, the controller 244 determines the target orientation as one of the portrait screen orientation and the landscape screen orientation when the vehicle state data corresponds to the accessory state or the operational state.

Next, at block 616 of the method 600, the controller 244 determines a target angular position of the smartphone 112 based on the status data 358. The target angular position includes one of the driver-oriented position and the passenger-oriented position. The controller 244 determines the target angular position as the driver-oriented position based on the occupancy data 362 when the occupancy data 362 identifies that the operator is located at the driver-seating position, and the controller 244 determines the target angular position as the passenger-oriented position based on the occupancy data 362 when the occupancy data 362 identifies that the operator is located at the passenger-seating position.

Next, at block 620 of the method 600, the controller 244 automatically moves the movable support 108 to position the smartphone 112 in the target orientation and the target angular position. Moving the smartphone 112 to the target angular position, positions the display 114 at an angle that is comfortable and convenient for the operator to view. Typically, with known in-vehicle smartphone supports, the operator manually adjusts the angle of the smartphone. With the movable support 108, however, the angle of the smartphone about the lift axis 164 is automatically adjusted based on at least the occupancy data 372. The movable support 108, therefore, is a "smart" device that knows the seating position of the operator and automatically moves the supported smartphone 112 to an optimal angular position for viewing by the operator. In addition, the movable support 108 intelligently controls the rotational orientation of the smartphone 112 based on at least the status data 358 to further increase operator comfort and ease of use of the smartphone 112.

As shown at block 620, after automatically moving the smartphone 112 with the movable support 108, the method 600 includes returning to block 608 to receive again the status data 385. The orientation and the position of the smartphone 112 are updated and/or changed based on the current status data 358.

According to the method 600, the movable support 108 promotes safe operation of the vehicle 104 by automatically orienting and positioning the smartphone 112. For example, by monitoring the drive mode data 366, the movable support 108 orientates the smartphone 112 in the flat screen orientation when the operator is concentrating on driving with the vehicle 104 in the operator-control drive mode. In the flat screen orientation, the display 114 is less visible and operator may be discouraged from interacting with the smartphone 112, thereby promoting the safe operation of the vehicle 104. Additionally, the method 600 provides for convenient use of the smartphone 112 when it is typically safe to do so, by detecting the park mode and the automated-drive control mode and then automatically rotating the smartphone 112 about the lift axis 164 to position the display 114 for viewing by the operator.

Additionally or alternatively, the smartphone 112 and/or the information display system 282 may be operated to activate the movable support 108 to automatically position the smartphone 112 in any desired position and/or orientation. For example, in some instances, an operator of the vehicle 104 may desire to activate the movable support 108 for positioning the smartphone 112 in a target position and a target orientation that is not based on the status data 358 or the content data 354, but is instead the operator's personal preference. Accordingly, a GUI is displayed on at least one of the displays 294, 114 providing the operator with control of the movable support 108 and enabling the operator to activate the motor units 136, 140, 148, 156 for moving the smartphone to any desired position and orientation. The operator uses at least one of the inputs 298, 318 to control the position and orientation of the supported smartphone 112.

Additionally or alternatively, the movable support 108 is configured to stabilize, orient, and/or position the smartphone 112 based on detected vehicle dynamics, such as motion, cornering, and/or acceleration. For example, the vehicle 104 and/or the smartphone 112 may include an IMU configured to detect a direction of acceleration of the vehicle 104. If unaccounted for, the acceleration of the vehicle 104 may cause the movable support 108 and/or the supported smartphone 112 to move from a selected position or orientation. The acceleration of the vehicle 104 may also shake the supported smartphone 112, such as when the vehicle 104 traverses bumpy roads, thereby making it difficult for the operator to clearly see the display screen 114. The movable support 108 is configured to maintain the selected position and/or orientation by counteracting the movements of the movable support 108 and the smartphone 112 that are caused by vehicle dynamics. The movable support 108 is also configured to stabilize the supported smartphone 112 in response to vehicle dynamics so that the display screen 114 is clearly visible even when the vehicle 104 traverse bumpy roads. To counteract the movement of the movable support 108 and to stabilize the supported smartphone 112, the controller 244 processes the acceleration signal(s) from the IMU and selectively activates the motor units 136, 140, 148, 156 to prevent movement of the movable support 108 and the supported smartphone 112 in response to acceleration of the vehicle 104.

As a further example, the operator of the vehicle 104 may be required to retake control of steering, accelerating, and/or braking of the vehicle 104 from the automated system(s) in a process referred to herein as a "takeover." When vehicle 104 requires a takeover, the controller 244 of the movable support 108 receives corresponding drive mode data 366 and then positions and/or orients the supported smartphone 112 accordingly. The movable support 108 may also configure the display screen 114 of the supported smartphone 112 to display a notification to the operator that a takeover is required.

Method of Operating the System Based on Temperature Data

Figure 15:
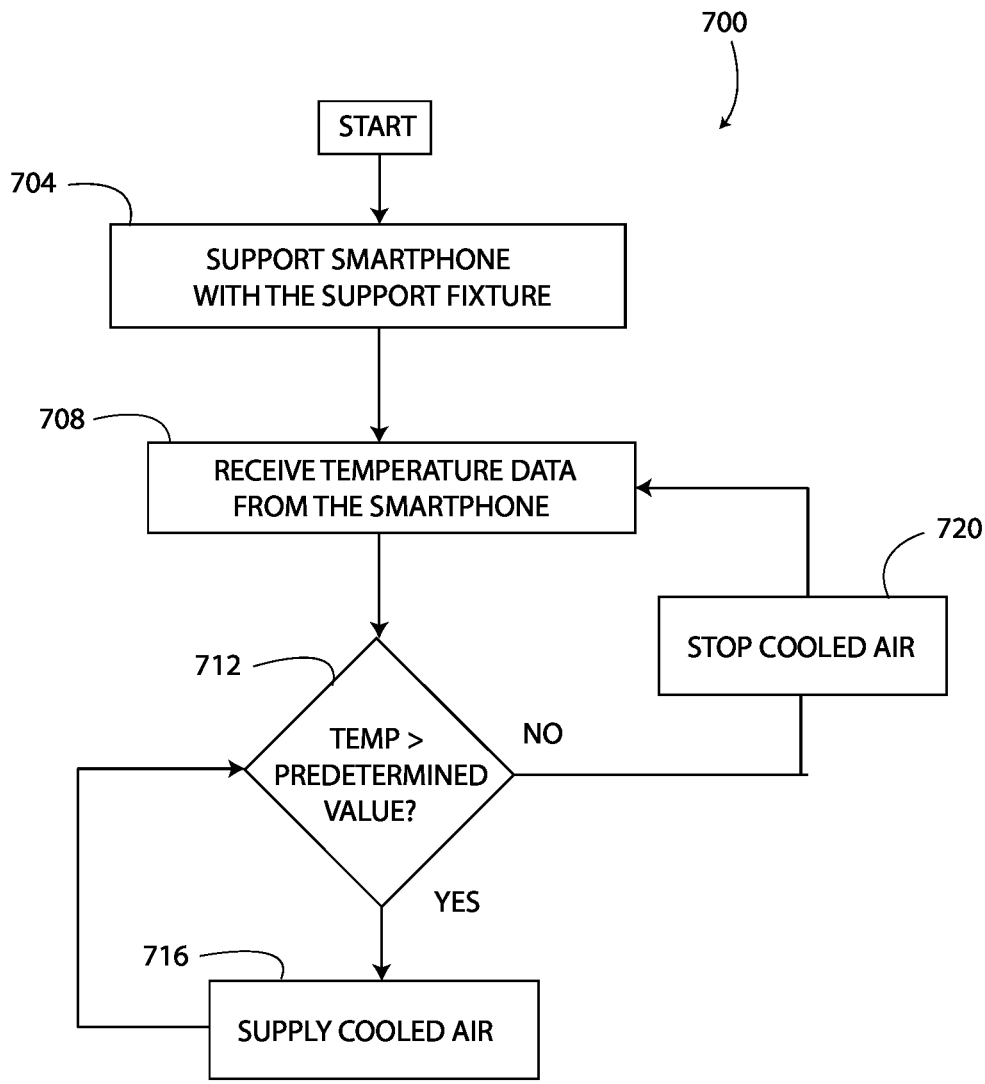
FIG. 15 is a flowchart illustrating an exemplary method of operating the system of FIG. 1 based at least on temperature data.

With reference to FIG. 15, a method 700 of operating the system 100 controls a supply of cooled air based on temperature data 374 (FIG. 7) in order to thermally manage the supported smartphone 112.

In block 704, the method 700 includes supporting the smartphone 112 with the movable support 108.

At block 708, the controller 244 is configured to receive the temperature data 374 from the smartphone 112. The temperature data 374 corresponds to an operating temperature of the smartphone 112. The smartphone 112 typically generates the temperature data 374 during normal operation. When connected to the movable support 108, the background app of the app data 322 is configured to cause the supported smartphone 112 to periodically transmit the temperature data 374 to the information display system 282 via the transceivers 302, 310. The information display system 282 transmits the temperature data 374 to the controller 244 of the control circuit 110 via the ECU 270, and the controller 244 stores the temperature data 374 in the memory 240.

In another embodiment, the temperature data 374 is generated by a temperature sensor (not shown) separate from the smartphone 112. For example, the temperature sensor may be mounted on the movable support 108. Additionally or alternatively, the temperature sensor may be a thermal camera (not shown) mounted within the vehicle 104 and having a field of view in which the supported smartphone 112 is located.

Next, at block 712 the controller 244 compares the operating temperature of the smartphone, from the temperature data 374, to a predetermined temperature value. The predetermined temperature value is also stored in the memory 374 and may be customized by the operator.

When the controller 244 determines that the operating temperature is greater than or equal to the predetermined temperature value, the controller 244 sends an electrical signal to the ECU 270 that causes the ECU 270 to activate the cooling system 286 for supplying the cooled air to the vent structures 188 (FIG. 4), as shown at block 716. The cooled air supplied by the cooling system 286 creates the paths of cooled air 200 that exit the vent structures 188 of the arm 128. With reference to FIG. 4, the movable support 108 is configured to support the smartphone 112 in the paths of cooled air 200. As the cooled air strikes the smartphone 112, the operating temperature of the smartphone 112 is reduced.

At block 712, when the operating temperature is less than the predetermined temperature value, then the controller 244 sends an electrical signal to the ECU 270 that causes the ECU 270 to deactivate the cooling system 286, so that the cooled air is not supplied to the vent structures 188, as shown at block 720.

Based on the above, the method 700 assists in maintaining and caring for the smartphone 112. As is known, smartphones 112 get warm/hot when used continuously and/or when operating processor/controller intensive apps. Often when smartphones 112 are used in vehicles, such as for navigation assistance, the smartphone 112 is placed in continuous operation and becomes warmer than desired by the operator. Moreover, the supported smartphone 112 is also exposed to direct sunlight, at certain times, which significantly increases the operating temperature of the smartphone 112. The method 700 operates the movable support 108 to automatically activates the deactivates the cooling system to create the paths of cooled air 200 for cooling the smartphone 112. As a result, the smartphone 112 is cooled to a comfortable and safe operating temperature.

Additionally or alternatively, as shown in FIGS. 8-12, another vent structure 378 is included in the center console 334 of the vehicle 104 separate from the movable support 108. The cooling system 286 is operably connected to the vent structure 378 and is configured to supply the vent structure 378 with cooled air via the main air channel 196 (FIG. 4) or another air channel. The cooling system 286 selectively supplies the vent structure 378 with cooled air according to the method 700.

In connection with the vent structure 378 shown in FIG. 12, in a further embodiment, the movable support 108 is configured to position the smartphone 112 in the path of cooled air 200 so as to optimize the cooling of the smartphone 112. For example, at block 712 when the operating temperature of the smartphone 112 indicates that cooling is required, in addition to supplying the vent structure 378 with the cooled air, the movable support 108 also changes the angular position and/or orientation of the smartphone 112 so that the smartphone 112 is positioned with an optimal amount of surface area against the cooled air 200. Typically, having more surface area of the smartphone 112 in the path of cooled air 200 results, in faster and more effective cooling of the smartphone 112. The smartphone 112 is moved about any one or more of the axes 164, 176, 180 to position the smartphone 112 in the path of the cooled air 200.

Additionally or alternatively, the supported smartphone 108 is cooled by conduction or by another cooling means, such as a Peltier cooling device (not shown) and/or a heatsink operably connected to the movable support 108. In another example, a fan system (not shown) is located in housing 152, 160 of the movable support 108. The fan system includes a rotatable impeller that is configured to generate an airflow of ambient temperature air through the vents 188 that is configured to cool the supported smartphone 112.

Position and Orientation Detection when Smartphone is Manually Moved

The controller 244 of the device orientation system 106 is configured to enable the operator to adjust the specific position and orientation of the smartphone 112 in each of the available positions and orientations to which the smartphone 112 is automatically movable. Accordingly, the positions and orientations are user-customizable.

In the landscape screen orientation, as shown in FIG. 11, the long edge of the display 114 is substantially horizontal, meaning that the long edge is within plus or minus 5° of horizontal. In the portrait screen orientation, as shown in FIG. 12, the long edge of the display 114 is substantially vertical, meaning that the long edge is within plus or minus 5° of vertical. The driver-oriented position is selected to position the display 114 of the supported smartphone 112 in view of the driver for most seat positions of the driver, and the passenger-orientated position is selected to position the display 114 of the supported smartphone 112 in view of the passenger for most seat positions of the passenger.

Some operators may desire to adjust slightly the exact position of the smartphone 112 when the smartphone 112 is in these positions and orientations. For example, in the portrait screen orientation, the operator may manually move the supported smartphone 112 to an updated orientation in which the long edge of the display 114 is angled at 10° of vertical so that glare from the sun does not obstruct viewing the display 114. In another example, a taller than average driver may rotate the supported smartphone 112 about the lift axis 164 to an updated angular position in order to comfortably view the display 114 from a selected seat position of the driver seat.

To account for manual adjustments of the position and orientation of the smartphone 112, the controller 244 is configured to determine when the operator has manually moved the smartphone 112 by monitoring positions of the motor shafts of the motors 246, 248, 250, 252 as detected and output by the motor controllers 256, 258, 260, 262. In particular, the controller 244 sets the position of the smartphone 112 using initial data. Then, the motor controllers 256, 258, 260, 262 and the motors 246, 248, 250, 252, which in this embodiment are provided as servomotors, implement a position feedback and control process that outputs a position of each motor 246, 248, 250, 252 when the pedestal 124, the arm 128, and the connection element 132 are manually moved. The motors 246, 248, 250, 252 may include a position encoder (not shown) to accomplish the position feedback and control. The controller 244 processes the motor positions output by the motor controllers 256, 258, 260, 262 to determine updated data of the pedestal 124, the arm 128, and the connection element 132. Then the controller 244 automatically changes the orientation and/or angular position to correspond to the updated orientation and/or position. That is, the initial data is exchanged for the updated data.

For example, if the supported smartphone 112 is moved slightly from the portrait screen orientation to an updated orientation, the portrait screen orientation is automatically changed to the updated orientation based on the updated data. In another example, if the supported smartphone 112 is moved slightly from the driver-oriented position to an updated driver-oriented position, the driver-orientated position is automatically changed to the updated angular position based on the updated data.

In one embodiment, the position and the orientation of the smartphone 112 are automatically updated based on seating adjustments made by the operator. For example, many vehicle seats are adjustable by the operator to a selected fore and aft position and a selected height position. When the operator makes a change to the position of the vehicle seat, the movable support 108 is configured to automatically reposition and reorient the supported smartphone 112 so that the supported smartphone 112 is optimally positioned for viewing by the operator.

Additionally or alternatively, the supported smartphone 112 is manually adjustable to any angular position and any orientation as desired by the operator. When the supported smartphone 112 is moved by the operator, the movable support 108 holds or maintains the position of the smartphone 112 in the moved position and orientation, much like a collaborative robot.

Enabling and Disabling Content and Features Based on Angular Position

Figure 16:
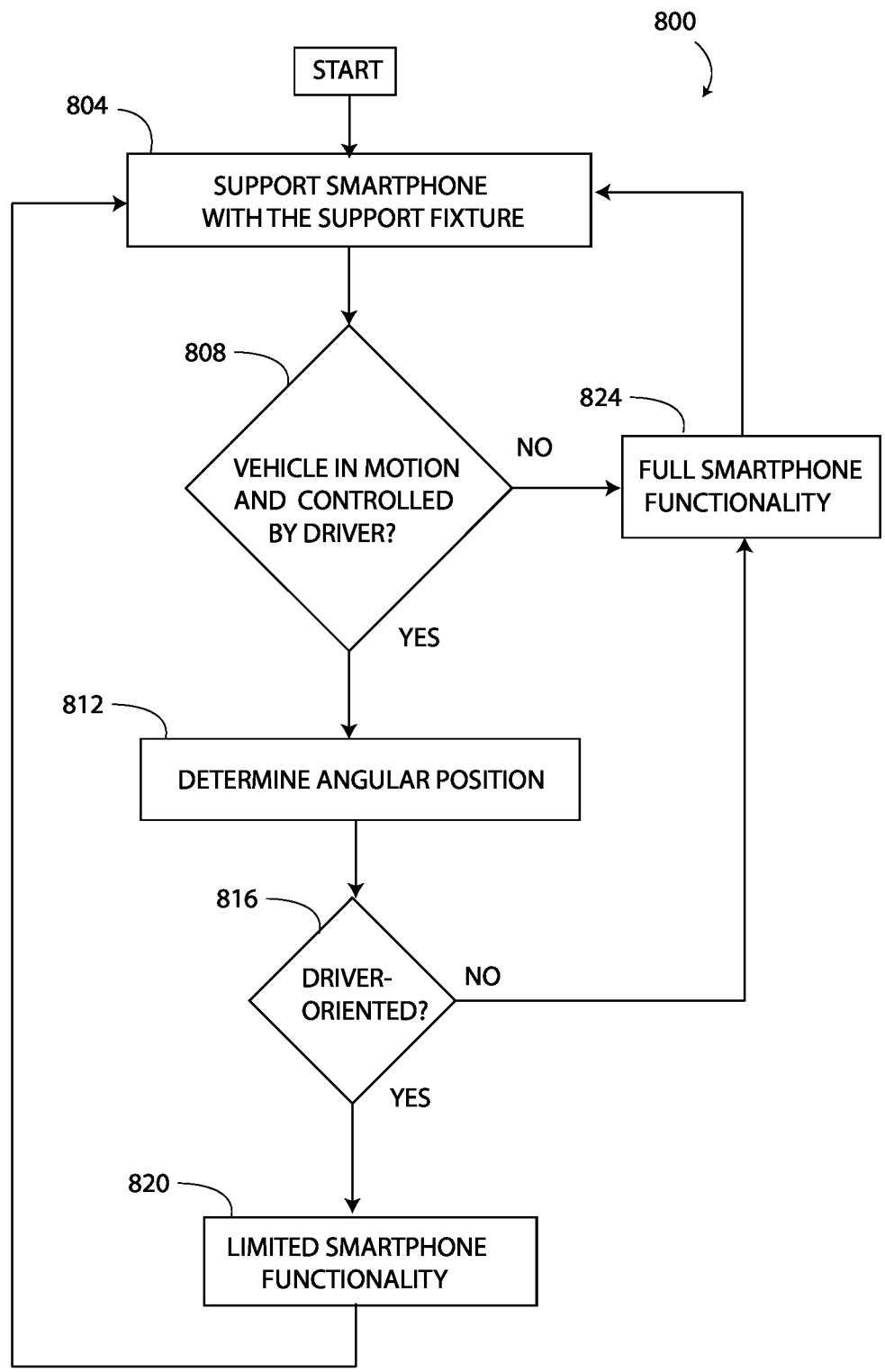
FIG. 16 is a flowchart illustrating an exemplary method of operating the system of FIG. 1 to enable and disable content and features of the supported smartphone.

With reference to FIG. 16, a method 800 of operating the system 100 enables and disables content and features of the smartphone 112 based on the angular position of the supported smartphone 112.

In block 804, the method 800 includes supporting the smartphone 112 with the movable support 108.

At block 808, the method 800 includes determining if the vehicle 104 is in motion and is being controlled by the driver. In one embodiment, a GPS application of the smartphone 112 is used to determine when the vehicle 104 is in motion. In another embodiment, the status data 358, such as the drive mode data 366 and the vehicle state data 370, are used to determine when the vehicle 104 is in motion. The vehicle 104 is determined to be under the control of the driver when the drive mode of the drive mode data 366 is the operator-drive control mode. The vehicle 104 is determined to be under computer control when the drive mode of the drive mode data 366 is the automated-drive control mode.

At block 812, when the vehicle 104 is determined to be in motion and under the control of the driver, the method 800 determines the angular position of the smartphone 112 as being either in the driver-orientated position in which the display 114 is positioned for the driver to most comfortably view, or the passenger-orientated position in which the display 114 is positioned for the passenger to most comfortably view.

Next, at blocks 816 and 820, when the determined position is the driver-orientated position, the movable support 108 sends a limit function signal to the smartphone 112. The limit function signal is transmitted from the controller 244, to the ECU 270, to the controller 278, and then is transmitted by the transceiver 302 to the transceiver 310 of the smartphone 112.

When the smartphone 112 receives the limit function signal, the controller 274 is configured to limit at least one function and/or content of the smartphone 112. For example, in response to receiving the limit function signal, the controller 274 may cause the input device 324 to stop receiving user inputs to prevent the driver from operating the input device 118 while also driving the vehicle 104. If the driver attempts to use the input device 118 during the limited functionality of block 820, then the display 114 or the display 294 may remind the driver to concentrate on the road and suggest to the driver that the smartphone 112 should be rotated to the passenger-oriented position and operated by a passenger to regain the desired function. The message to the driver may also suggest that the driver should stop the vehicle 104 in a safe area to regain the functionality. Exemplary content that may be limited at block 820 includes games and texting apps. Any other feature and/or content of the smartphone 112 that may distract the driver may also be limited or stopped at block 820.

At blocks 808 and 824 of the method 800, when the vehicle 104 is under computer control and/or is stationary, then the smartphone 112 is provided with full functionality and a full function signal is sent to the smartphone 112 from the controller 244. Similarly, at blocks 816 and 824 of the method 800, when the determined position is the passenger-oriented position, then the smartphone 112 is provided with full functionality.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of operating a movable support for orienting and positioning a portable computing device in a vehicle, the method comprising:
supporting the portable computing device with the movable support;
receiving status data based on a status of the vehicle with a controller;
determining a target orientation of the portable computing device based on the status data with the controller, the target orientation including one of a portrait screen orientation and a landscape screen orientation;
determining a target angular position of the portable computing device based on the status data, the target angular position including one of a driver-oriented position and a passenger-oriented position; and
using the controller to move the movable support to position the portable computing device in the target orientation and the target angular position.

2. The method as claimed in claim 1, wherein supporting the portable computing device comprises:
magnetically connecting a connection element of the movable support to the portable computing device.

3. The method as claimed in claim 2, further comprising:
supplying a charging current from the vehicle to the magnetically connected portable computing device through a power interface of the connection element.

4. The method as claimed in claim 1, wherein:
the status data comprises occupancy data of the vehicle,
the occupancy data identifies that an operator of the portable computing device is located at one of a driver-seating position and a passenger-seating position,
determining the target angular position comprises determining the target angular position as the driver-oriented position based on the occupancy data when the occupancy data identifies that the operator is located at the driver-seating position, and determining the target angular position comprises determining the target angular position as the passenger-oriented position based on the occupancy data when the occupancy data identifies that the operator is located at the passenger-seating position.

5. The method as claimed in claim 1, wherein:
the status data comprises drive mode data of the vehicle,
the drive mode data identifies the vehicle as being in a park mode, an operator-drive control mode, or an automated-drive control mode,
the target orientation further includes a flat screen orientation in which a screen plane of the portable computing device is substantially horizontal,
determining the target orientation comprises determining the target orientation as the flat screen orientation when the drive mode data corresponds to the operator-drive control mode, and
determining the target orientation comprises determining the target orientation as one of the portrait screen orientation and the landscape screen orientation when the drive mode data corresponds to the park mode or the automated-drive control mode.

6. The method as claimed in claim 1, further comprising:
determining, with the controller, that the supported portable computing device and the movable support have been moved from the driver-orientated position to an updated angular position; and
automatically changing the driver-oriented position to correspond to the updated angular position.

7. The method as claimed in claim 1, further comprising:
determining, with the controller, that the supported portable computing device and the movable support have been moved from the portrait screen orientation to an updated orientation; and
automatically changing the portrait screen orientation to correspond to the updated orientation.

8. The method as claimed in claim 1, wherein:
the target orientation further includes a flat screen orientation in which a screen plane of the portable computing device is substantially horizontal,
the status data comprises vehicle state data,
the vehicle state data is selected from the group consisting of an off state, an accessory state, or an operational state,
determining the target orientation comprises determining the target orientation as the flat screen orientation when the vehicle state data corresponds to the off state, and
determining the target orientation comprises determining the target orientation as one of the portrait screen orientation and the landscape screen orientation when the vehicle state data corresponds to the accessory state or the operational state.

9. A method of operating a movable support for orienting and positioning a portable computing device in a vehicle, the method comprising:
detecting that the portable computing device is supported by the movable support;
identifying content data with the supported portable computing device, the content data corresponding to a content type of an active application operating on the portable computing device;
determining orientation data based on the content data with the portable computing device, the orientation data corresponding to a target orientation of the supported portable computing device for the content type of the content data, and the target orientation including one of a portrait screen orientation and a landscape screen orientation;
transmitting the orientation data from the supported portable computing device to a controller; and
using the controller to move the movable support to position the portable computing device in the target orientation based on the transmitted orientation data.

10. The method as claimed in claim 9, wherein:
the content type is selected from the group consisting of movie content, music content, navigation content, communication content, or social media content,
the orientation data for the movie content and the navigation content correspond to the landscape screen orientation, and
the orientation data for the music content, the communication content, and the social media content correspond to the portrait screen orientation.

11. The method as claimed in claim 9, wherein:
the movable support includes:
a pedestal movably mounted to an interior structure of the vehicle,
a pedestal motor operably connected to the pedestal and configured to move the pedestal relative to the interior structure,
an arm movably mounted to the pedestal,
an arm motor operably connected to the arm and configured to move the arm relative to the pedestal,
a connection element operably connected to the arm and configured for connection to the portable computing device,
an element motor operably connected to the connection element and configured to move the connection element relative to the arm, and
automatically moving the movable support includes selectively activating at least one of the pedestal motor, the arm motor, and the element motor.

12. The method as claimed in claim 9, further comprising:
receiving control data from an in-vehicle infotainment system of the vehicle with the controller, the control data corresponding to a vehicle-controlled orientation of the portable computing device; and
using the controller to move the movable support to position the portable computing device in the vehicle-controlled orientation in response to receiving the control data with the controller.

13. A system, comprising:
a vent structure;
a cooling system of a vehicle operably connected to the vent structure and configured to selectively supply the vent structure with cooled air, the cooling system cooperating with the vent structure to create at least one path of cooled air;
a movable support configured to support a portable computing device in the at least one path of cooled air, the movable support including a connection element configured to connect magnetically and electrically to a portable computing device; and
a controller operably connected to the cooling system, the movable support, and the portable computing device, the controller configured to receive temperature data from the portable computing device, the temperature data corresponding to an operating temperature of the portable computing device, the controller further configured to control the supply of the cooled air to the vent structure based on the temperature data.

14. The system as claimed in claim 13, wherein the movable support further comprises:
a pedestal movably mounted to an interior structure of the vehicle;
a pedestal motor operably connected to the pedestal and configured to move the pedestal relative to the interior structure;
an arm movably mounted to the pedestal;
an arm motor operably connected to the arm and configured to move the arm relative to the pedestal, the connection element operably connected to the arm; and
an element motor operably connected to the connection element and configured to move the connection element relative to the arm,
wherein the controller is operably connected to the pedestal motor, the arm motor, and the element motor, for automatically positioning the portable computing device in the at least one path of cooled air.

15. The system as claimed in claim 14, wherein the controller is further configured to:
receive status data based on a status of the vehicle;
determine a target orientation of the portable computing device based on the status data, the target orientation including one of a portrait screen orientation and a landscape screen orientation;
determine a target angular position of the portable computing device based on the status data, the target angular position including one of a driver-oriented position and a passenger-oriented position; and
move the movable support to position the portable computing device in the target orientation and the target angular position by selectively activating at least one of the pedestal motor, the arm motor, and the element motor.

16. The system as claimed in claim 14, wherein the controller is further configured to:
receive content data from the supported portable computing device, the content data corresponding to a content type of an active application operating on the portable computing device;
determine orientation data based on the content data, the orientation data corresponding to a target orientation of the supported portable computing device for the content type of the content data, and the target orientation including one of a portrait screen orientation and a landscape screen orientation; and
automatically move the movable support to position the portable computing device in the target orientation based on the orientation data by selectively activating at least one of the pedestal motor, the arm motor, and the element motor.

17. The system as claimed in claim 16, wherein:
the content type is selected from the group consisting of movie content, music content, navigation content, or social media content,
the orientation data for the movie content and the navigation content corresponds to the landscape screen orientation, and
the orientation data for the music content and the social media content correspond to the portrait screen orientation.

18. The system as claimed in claim 14, wherein the vent structure is included in the arm.

19. The system as claimed in claim 18, wherein:
the pedestal defines a pedestal air channel operably connected to the cooling system and configured to receive the supply of cooled air, and
the arm includes an arm air channel operably connected to the pedestal air channel and the vent structure to receive the supply of cooled air.

20. The system as claimed in claim 14, wherein:
in a retracted position of the pedestal, a connection surface of the connection element is located in a plane defined by an outer surface of the interior structure.

* * * * *